United States Patent [19]

Jones

[11] Patent Number: 4,459,937
[45] Date of Patent: Jul. 17, 1984

[54] HIGH RATE RESIST POLYMERIZATION APPARATUS

[75] Inventor: Addison B. Jones, Yorba Linda, Calif.

[73] Assignee: Rockwell International Corporation, El Segundo, Calif.

[21] Appl. No.: 397,646

[22] Filed: Jul. 12, 1982

Related U.S. Application Data

[62] Division of Ser. No. 257,822, Apr. 27, 1981, Pat. No. 4,357,364.

[51] Int. Cl.³ .............................................. C23C 13/08
[52] U.S. Cl. .................................. 118/50.1; 118/722
[58] Field of Search .............. 118/727, 641, 642, 643, 118/50.1

[56] References Cited

U.S. PATENT DOCUMENTS 3,560,258  2/1971  Brisbane ........................... 427/99 X Primary Examiner—Thurman K. Page
Attorney, Agent, or Firm—H. Fredrick Hamann; Wilfred G. Caldwell

[57] ABSTRACT

An improvement in the method of forming polymerization resists by directing high energy particles such as electron beams along a path across a vacuum chamber and onto polymerizable molecular species at a substrate surface with sufficient energy to polymerize the polymerizable molecular species in situ is provided, comprising maintaining a chamber-isolated relatively higher pressure layer of polymerizable molecular species vapor locally at the substrate surface during, e.g. electron beam exposure to form the resist while maintaining the beam path free of polymerizable molecular species during beam traverse of the chamber. Polymerization resist generation apparatus is also provided comprising a high energy particle, e.g. electron beam source including an electron beam gun and a vacuum chamber therebeyond, means adapted to support a substrate having a surface on which a resist is to be generated in electron beam exposed relation, means defining a closed volume between the supported substrate and the electron beam source, and means to introduce polymerizable molecular species vapor into the closed volume for electron beam exposure and polymerization in situ on the substrate surface.

3 Claims, 1 Drawing Figure

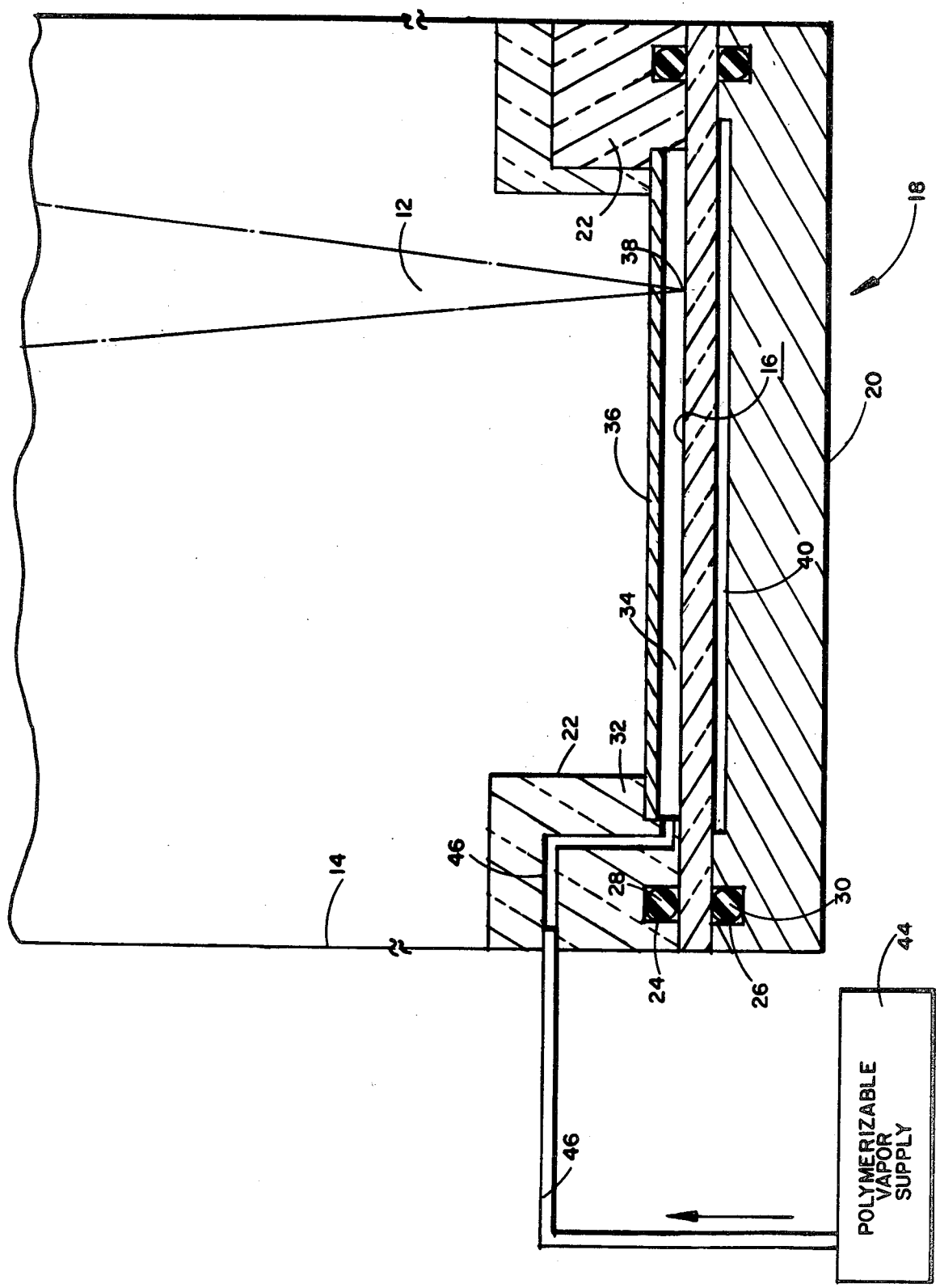

HIGH RATE RESIST POLYMERIZATION APPARATUS

This application is a division of application Ser. No. 257,822, filed Apr. 27, 1981, now U.S. Pat. No. 4,357,364.

TECHNICAL FIELD

This invention has to do with the manufacture of integrated circuits, particularly very large scale integrated circuits, and more particularly with improvements in the generation of resists during integrated circuit manufacture, for high precision resolution of circuit patterns. The invention is particularly concerned with resist formation by polymerization techniques, and with improvements in known resist formation techniques which enable enhanced speed, accuracy of placement and minimization of linewidth.

BACKGROUND ART

The delineation of circuit patterns by the formation and selective removal of resist masks is well known and widely practiced. One form of resist is the polymerization resist in which a polymerizable molecular species is selectively irradiated at a surface to form a patterned thin film. It is known to form polymerization resists by electron beam or other high energy particle exposure of the polymerizable molecular species in situ on the substrate to be masked. The presence of polymerizable molecular species accidently in irradiation zones has been known to cause the inadvertent formation of so-called "contamination" resists. See, for example, "Electrode Contamination in Electron Optical Systems", K. M. Poole, 1953 pp. 542–547; "Direct Measurement of Contamination and Etching Rates in an Electron Beam", R. F. Egerton, et al, 1976 J. Phys. D: Appl. Phys. Vol. 9, pp. 659–663. The deliberate formation of such resists has been practiced by applying a coating of the polymerizable molecular species onto the substrate surface, and by exposing the coated substrate to electron beam energy. Additionally, use has been made of the deliberate introduction of increased concentrations of volatile polymerizable species into the vacuum ambient required for electron or ion beam resist exposure. See, for example: "Formation of Thin Polymer Films by Electron Bombardment" 1960 J. Appl. Phys. Vol. 31 No. 9, pp. 1680–1683; and "Electron-beam Fabrication of 80-A Metal Structures" A. N. Broers et al 1976 Applied Physics Letters, Vol. 29, No. 9, pp. 596–598.

A difficulty with the use of the vapor method has been the slowness of rate of film formation owing, at least in part, to the absence of adequate concentrations of vapor; where increased concentrations of vapor are used to increase rate, there is, however, erratic, unacceptable distortion of the electron beam as it passes through the vapor.

A further difficulty with known polymerization resist techniques for pattern delineation purposes lies in the scattering of the high energy particle beam by the vapor, which precludes high rate polymerization of vapor by electron beam polymerization in situ on the substrate surface without unacceptable sacrifice of pattern resolution resultant from beam distortion by the vapor being polymerized.

DESCRIPTION OF THE INVENTION

It is, therefore, an object of the present invention to provide improvements in the generation of polymerization resists with high energy particles, such as electron beams and ion beams, both in rate of film formation for more economical processing and manufacture, and in precision of pattern and minimum linewidths through minimum distortion of the high energy particle beam. It is a further object to provide method and apparatus for polymerization resist generation in which the concentration of vapor is increased selectively in the vicinity of the substrate surface, while maintaining the beam path free of polymerizable molecular species vapor causing distortion of the beam. It is another object to increase the partial pressure of polymerizable molecular species vapor at the substrate surface locally by confining the vapor there beyond the vacuum chamber in which the ion or electron beam is generated and directed and at a pressure conducive to rapid film formation and higher than the pressure elsewhere within the vacuum chamber. It is a highly particular object to provide method and apparatus in which a membrane substantially transparent to electron or ion beams confines the polymerizable vapor adjacent the substrate surface enabling rapid polymerization while preserving the integrity of the beam path chamber, and in a manner that the beam is not distorted in the chamber or in the substrate surface-adjacent layer of polymerizable molecular species.

These and other objects of the invention to become apparent thereinafter, are realized in accordance therewith in the method of forming polymerization resists, which includes directing high energy particles along a path across a vacuum chamber and onto polymerizable molecular species at a substrate surface with sufficient energy to polymerize the polymerizable molecular species in situ, through the improvement comprising maintaining a chamber-isolated relatively higher pressure layer of polymerizable molecular species vapor locally at said substrate surface during high energy particle exposure to form the resist while maintaining said particle path substantially free of polymerizable molecular species during beam traverse of said chamber.

Typically, the polymerizable molecular species vapor layer is at a vapor pressure which at a given thickness is normally disruptive of electron or ion beam travel, and the method therefore includes maintaining the polymerizable molecular species layer at a lesser thickness than the given thickness; the polymerizable molecular species vapor layer is at a pressure not less than about $10^{-4}$ Torr during electron beam exposure; the polymerizable molecular species vapor layer is selectively communicated with a polymerizable vapor supply beyond the chamber; and an electron or ion beam is generated as the source of high energy particles.

In preferred embodiments, the method includes partitioning the chamber into two zones including a relatively lower pressure chamber first zone which is maintained at a pressure less than $10^{-4}$ Torr, and a relatively higher pressure chamber second zone containing the polymerizable vapor in chamber first zone isolated relation; defining a wall of the chamber second zone with the substrate surface portion; extending an electron or ion beam transparent, polymerizable molecular species impermeable, self-supporting membrane across the chamber parallel to the substrate surface and spaced therefrom a distance to define a second wall of the chamber second zone in chamber partitioning relation;

generating an electron or ion beam as the source of the high energy particles; and effecting the mentioned partitioning of the chamber with an electron or ion beam transparent membrane extended across the chamber above the substrate.

As in other embodiments, where the polymerizable molecular species layer is at a vapor pressure of about $10^{-4}$ to 1 Torr which at a given thickness for the polymerizable molecular species is normally disruptive of electron or ion beam travel, the method includes maintaining the polymerizable molecular species layer at a lesser thickness than the given thickness, use of a volatile polymerizable molecular species which is an electron or ion beam crosslinkable polymer precursor, selectively communicating the chamber second zone with a polymerizable vapor supply beyond the chamber first and second zones, defining the lower wall of the chamber second zone with the substrate surface, and extending the membrane across the chamber parallel to the substrate surface and spaced therefrom to define the upper wall of the chamber second zone in chamber partitioning relation.

The invention contemplates apparatus for carrying out the method in the form of a high energy particle polymerization resist generation apparatus, comprising a high energy particle source and a vacuum chamber therebeyond, and within said vacuum chamber: means adapted to support a substrate having a surface on which a resist is to be generated in high energy particle exposed relation, means defining a closed volume between the supported substrate and the source, and means to introduce polymerizable molecular species vapor into the closed volume for high energy particle exposure and polymerization in situ on the substrate surface.

In preferred embodiments, the apparatus includes also an electron beam gun source of electrons as the high energy particles; the closed volume defining means comprises an electron beam transparent, polymerizable vapor impermeable membrane and support structure therefor relative to the substrate whereby a closed volume is maintained between the membrane and the substrate; and the membrane comprises a thin film of synthetic organic polymer, metal, semiconductor, or inorganic dielectric which is self-supporting above the substrate surface exposed to the electron beam.

THE DRAWING

The invention will be further described as to an illustrative embodiment thereof in conjunction with the attached drawing in which the single FIGURE generally in vertical section and partly schematic depicts one form of apparatus according to the invention.

PREFERRED MODE

Bombardment of organic polymerizable molecular species by an electron beam, an ion beam, or other high energy particles results in polymerization, probably by a free radical polymerization mechanism, of ambient species present at or on the surface intended to be bombarded by the beam. Advantage can be taken of this phenomenon to form pattern resists by selectively polymerizable molecular species at a surface on which a pattern is desired. To do this a vapor of polymerizable molecular species is provided in the exposure zone and upon irradiation the polymerizable molecular species polymerizes upon the substrate in the pattern determined by the beam direction and travel. It is evident that the rate of resist formation by this technique is severly limited by the rate at which the polymerizable molecular species arrives at the surface of the substrate as well as by the kinetics of polymerization of the particular polymerizable molecular species by the particular beam, which is a function of the sensitivity of the polymerizable molecular species and the current density of the beam.

The present method and apparatus focus on increasing relatively the partial pressure of the polymerizable molecular species vapor at the substrate surface while keeping the vapor species from the vacuum chamber which the beam traverses, for the dual purpose of avoiding distortion of the beam resultant from collision with the large constituent molecules, and of maximizing polymerization rate through concentration of polymerizable species at the surface on which the resist pattern is to be formed.

Rate of polymerization, assuming a given beam current density and a particular polymerizable molecular species, varies with molecular arrival rate of the substrate which in turn is dependent on the polymerizable molecular species partial pressure. If, for a given molecular species being bombarded at a surface in an electron beam system at pressures of about $10^{-6}$ Torr, one monolayer/second of resist is formed, increasing the partial pressure of the polymerizable molecular species to 1 Torr may increase the rate to $10^4$ monolayers/second, assuming sufficient beam current to maintain such a rate. Thus, an exposure requiring one hour at $10^{-6}$ Torr could be accomplished in a fraction of a second at 1 Torr.

It is not desirable to use pressures much greater than about $10^{-6}$ in an electron beam vacuum chamber since at higher pressures, operation is erratic and unreliable. Thus polymerization resist formation in previously known apparatus has not been practical at rates greater than the relatively slow rate method.

Through the use of a partitioned apparatus, however, as taught herein, the vacuum chamber is maintained generally free of polymerizable molecular species vapor, but the region immediately adjacent the substrate surface where the polymerization is desired is rich with such polymerizable molecular species vapor. A membranous film impermeable to the polymerizable molecular species vapor, and impervious to chemical attack thereby, and which is both transparent to the high energy particles, e.g. the beam electrons or ions, and self-supporting by itself or in conjunction with another suitable material connected to it, is used to partition the chamber. Among suitable polymerizable molecular species are low molecular weight organic compounds containing aliphatic or aromatic unsaturation, and polymers thereof, e.g. polyparaxylylene (Trademark Paralene) silicones such as methylphenylpolysiloxane, hydrocarbon and silicone lubricating oils, polyimides and the like. Typically useful materials are referred to in the articles identified above which are incorporated herein by this reference.

The polymerizable molecular species preferably have a vapor pressure in the $10^{-4}$ to 1 Torr range at room temperature and are polymerization responsive to high energy particle exposure, i.e. exhibit a higher rate of polymerization than scission at exposure levels, and which particularly include negative resist materials and silicone oils.

An electron beam is the preferred source of high energy particles. Other suitable high energy particles include protons and other ions. Current density levels are chosen to match the rate of arrival of the polymerizable molecular species at the substrate target, as a function of the particular species selected, the specie's vapor pressure, the temperature of the substrate, electron energy levels, and other factors, including the desirability of minimizing damage to the substrate. In general, higher substrate temperatures increase species mobility on the substrate surface, increasing the rate of polymerization.

With reference now to the FIGURE, a conventional electron beam gun (not shown on this FIGURE) directs a beam 12 along a predetermined path indicated by the several dotted lines across a vacuum chamber 14 in a pattern desired for formation of the polymerization resist and at an adequate current density for the purpose. The beam 12 is directed at substrate 16 which is typically a silicon semiconductor at a particular stage of processing where it is desired to mask off one or more areas of the substrate, or a predeposited coating on the substrate, for purposes of selective etching or deposit of additional material in a predetermined pattern on the substrate. The substrate is supported at the lower end of the vacuum chamber 14 by a frame 18 having base 20 and sidewall 22, provided with opposed annular grooves 24, 26 into which O-ring seals 28, 30 are snugly fitted. Substrate 16 is held between the base 20 and sidewall 22 by means not shown in sealed relation by virtue of the O-rings 28, 20. Frame wall 22 has an interior shoulder 32 which overlies the periphery 34 of the substrate 16. A vapor impermeable, self supporting film 36 of polyimide, 0.5 micron thick is secured adhesively or by fasteners not shown to the frame sidewall shoulder 32 to extend across the beam target area 38 between the beam source, and the substrate 16. The film 36 lies about 10 to 60 microns above the substrate forming a small zone 40 thereby, below and separated from the larger zone 42 defined by the vacuum chamber 14 by the film 36. The polymerizable species, e.g. silicone oil, is supplied from supply 44 through inlet line 46 at a rate sufficient to maintain sufficient quantity of polymerizable molecular species vapor in the zone 40 during beam exposure for adequate resist formation. As the beam impinges on the species, it polymerizes on the substrate 16 in areas corresponding to and defined by the beam impingement pattern.

The pressure within zone 40 is in the range of $10^{-4}$ to 1 Torr which is optimum for resist polymerization. The pressure in the vacuum chamber, on the other hand is less than $10^{-4}$ Torr which is optimum for untrammeled beam propagation.

The thickness of the film 36, and the transverse extent of the zone 40 are each selected such that the distortion of the beam passing them is minimized, contributing maximum precision in forming the desired pattern, despite the presence of vapor of the polymerizable molecular species in the zone 40. The thickness of the polymerizable molecular species vapor layer, delimited by the height of the zone 40, is insufficient to cause troublesome distortion of the beam.

Thus the objectives first set out are realized. Beam traversal of the vacuum chamber is free of interference because the vapor is not in the major portion of the chamber. The thickness of vapor at the substrate is selected to be insufficient to interfere with the beam there. The amount of vapor used is concentrated at the surface where it is to polymerize, resulting in large efficiencies. The film membrane which divides the chamber into vapor free and vapor rich zones, to the extent the nature of the film barrier and sealing will allow, is itself non-interfering with the charged particle beam precision. The result is a more precise, and more efficient, in terms of production of parts and in terms of consumption of materials, process, and in terms of better resolution of intended pattern as well.

I claim:

1. High energy particle polymerization resist generation apparatus, comprising in combination:

a high energy particle source;

a vacuum chamber in proximity to said source for receiving particles from the source;

means for supporting a substrate within the chamber having a surface on which a resist is to be generated in high energy particle exposed relation;

means defining a closed volume chamber adjacent said surface between the supported substrate and said source;

the surface of the closed volume chamber facing the source adapted to be impacted by said particles comprising a high energy particle beam transparent, polymerizable vapor impermeable membrane;

said closed chamber containing polymerizable molecular species vapor therein;

means for maintaining polymerizable molecular species vapor in said closed chamber at a predetermined pressure whereby high energy exposure of said species vapor via said surface of the chamber establishes polymerization in situ on said substrate surface as a resist.

2. High energy particle polymerization resist generation apparatus according to claim 1, including also an electron beam gun source of electrons as the high energy particles.

3. Electron beam polymerization resist apparatus according to claim 1, in which said membrane comprises synthetic organic polymeric film which is self-supporting above the substrate surface exposed to the electron beam.

* * * * *

UNITED STATES PATENT AND TRADEMARK OFFICE
CERTIFICATE OF CORRECTION

PATENT NO. : 4,459,937
DATED : July 17, 1984
INVENTOR(S) : Addison B. Jones

It is certified that error appears in the above-identified patent and that said Letters Patent are hereby corrected as shown below:

Column 3, line 62, after the word "selectively" and before the word "poly-" add ---polymerizing a---.

Column 5, line 20, after the word "or" and before the word "a" add ---of---.

Column 4, line 38, change the word "method" to read ---noted---.

Column 5, line 36, change "60" to read ---50---.

Signed and Sealed this

Twenty-third Day of July 1985

[SEAL]

Attest:

DONALD J. QUIGG

Attesting Officer     Acting Commissioner of Patents and Trademarks